United States Patent [19]
Yamkovoy

[11] Patent Number: 6,033,245
[45] Date of Patent: Mar. 7, 2000

[54] SELF-ALIGNING ELECTRICAL CONNECTOR

[75] Inventor: Paul G. Yamkovoy, Acton, Mass.

[73] Assignee: Simplex Time Recorder Co., Gardner, Mass.

[21] Appl. No.: 08/985,723

[22] Filed: Dec. 5, 1997

[51] Int. Cl.[7] .................................................. H01R 13/64
[52] U.S. Cl. ............................................ 439/246; 439/947
[58] Field of Search ................................ 439/246, 81, 84, 439/839, 857

[56] References Cited

U.S. PATENT DOCUMENTS 5,679,010  10/1997  Hotea et al. ............................ 439/246

OTHER PUBLICATIONS

Drawing No. 474–302, PCB Tinnerman Clip, Apr. 14, 1997.

Drawing No. 617–863, Spade Contact, Smoke, Jan. 5, 1996.

*Primary Examiner*—Michael L. Gellner
*Assistant Examiner*—Antoine Ngandjui
*Attorney, Agent, or Firm*—Hamilton, Brook, Smith & Reynolds, P.C.

[57] ABSTRACT

A self-aligning electrical connector for providing electrical communication between two electrical devices includes an electrical contact. A terminal system is resiliently coupled to the electrical contact by a resilient frame. The resilient frame is capable of allowing the electrical contact to move relative to the terminal system along X and Y axes.

29 Claims, 9 Drawing Sheets

SELF-ALIGNING ELECTRICAL CONNECTOR

BACKGROUND OF THE INVENTION

Small electrical connectors are often mounted to PC boards for enabling the PC boards to be coupled to a power or signal source. These connectors typically engage with a rigid contact which is in electrical communication with the power or signal source. FIG. 1 depicts a prior art electrical connector 8 formed from a flat, rectangular piece of sheet metal with two opposing contact tabs 6 formed in the center. The ends of the contact tabs 6 have a V-shape formed therein. The connector 8 includes two terminal pins 7 extending downwardly from the connector 8 for soldering to a PC board. When a rigid contact 9 is inserted into the gap between the two opposing contact tabs 6 to engage with connector 8, the tabs 6 are pushed slightly upwardly.

SUMMARY OF THE INVENTION

A drawback with the design of FIG. 1 is that the contact tabs 6 can be bent upwardly beyond their yield point such that the gripping force of the contact tabs 6 on the rigid contact 9 is greatly reduced, thereby affecting the electrical connection therebetween. This can occur if the connector and the rigid contact are not in proper alignment during engagement. This can also occur when there is vibration, shock or thermal expansion of parts in the assembly containing the connector 8 and rigid contact 9 after engagement.

The present invention is directed to a self-aligning electrical connector for providing electrical communication between two electrical devices which can compensate for misalignment, vibration, shock or thermal expansion without losing electrical communication. The connector includes an electrical contact which is resiliently coupled to a terminal system by a resilient frame. The resilient frame allows the electrical contact to move relative to the terminal system along X and Y axes.

In preferred embodiments, the connector is formed from sheet metal. The terminal system includes two terminal pins which are typically soldered to a PC board. The resilient frame has two resilient beams, each resiliently coupled between a respective terminal pin and the electrical contact. The terminal pins extend downwardly from respective resilient beams. Each resilient beam includes a proximal portion capable of deflecting along one of the X and Y axes and a distal portion capable of deflecting along the other of the X and Y axes. The proximal beam portion and the distal beam portion are preferably formed at right angles relative to each other. The electrical contact has two opposing grippable contact tabs, each having two pointed contact tips for engaging a mating rigid contact therebetween. The contact tabs are angled upwardly and separated by a gap. The contact tabs are capable of resiliently deflecting upwardly when engaged with the rigid contact.

In the preferred embodiment, the resilient frame has a planar portion from which the electrical contact extends. A pair of vertical side walls extend upwardly from opposite edges of the planar portion. The resilient beams extend from at least one side wall. The planar portion is capable of resiliently bowing upwardly and the side walls are capable of resiliently twisting when the contact tabs are resiliently deflected upwardly by the rigid contact. As a result, movement of the contact tabs upwardly is provided by the combination of the bowing of the planar portion, the twisting of the side walls and the deflection of the contact tabs. This reduces the possibility of deflecting the contact tabs beyond their yield point and provides a consistent electrical connection. A portion of each resilient beam extends over the planar portion, thereby limiting the amount of bowing of the planar portion.

The present invention electrical connector is formed from sheet metal making it inexpensive to manufacture and can be employed for providing power or signals to a PC board, electrically connecting PC boards together, or electrically connecting electronic assemblies together.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Figure 1:
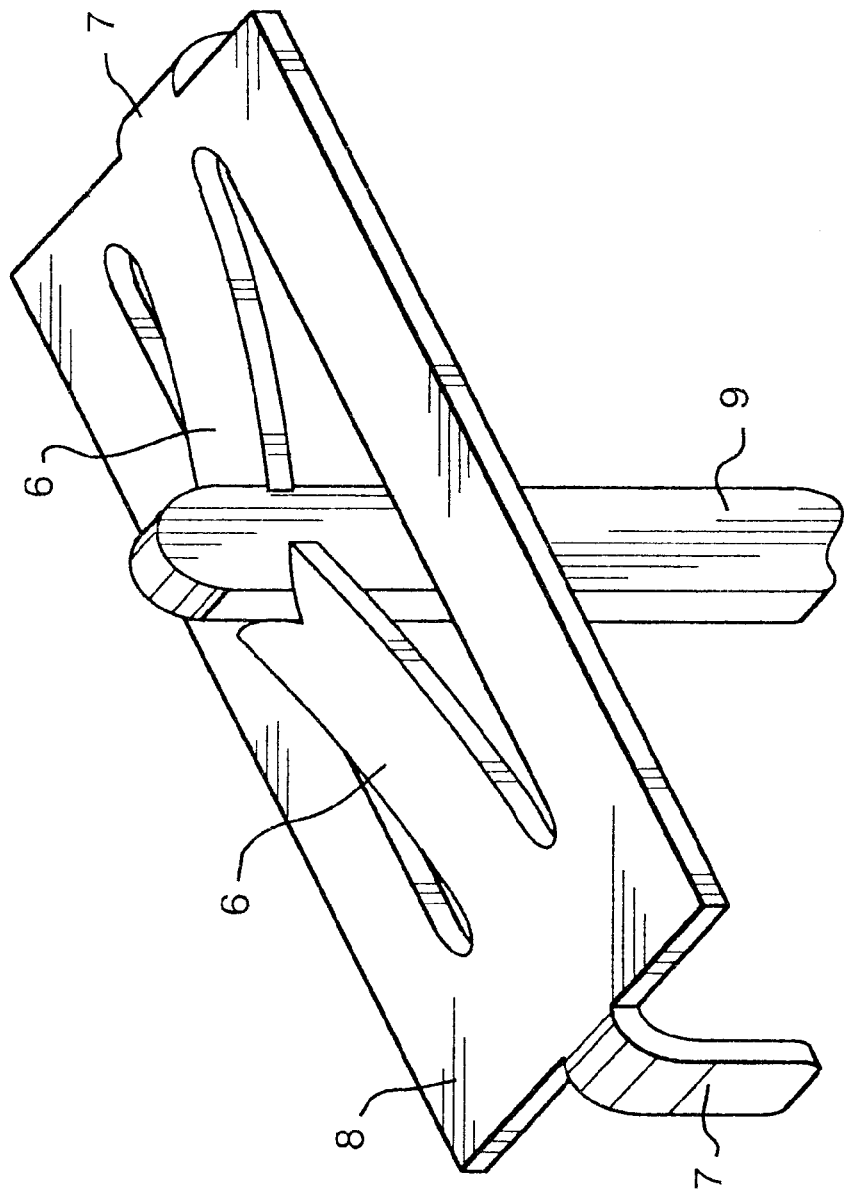
FIG. 1 is a perspective view of a prior art electrical connector engaged with a rigid contact.
Figure 2:
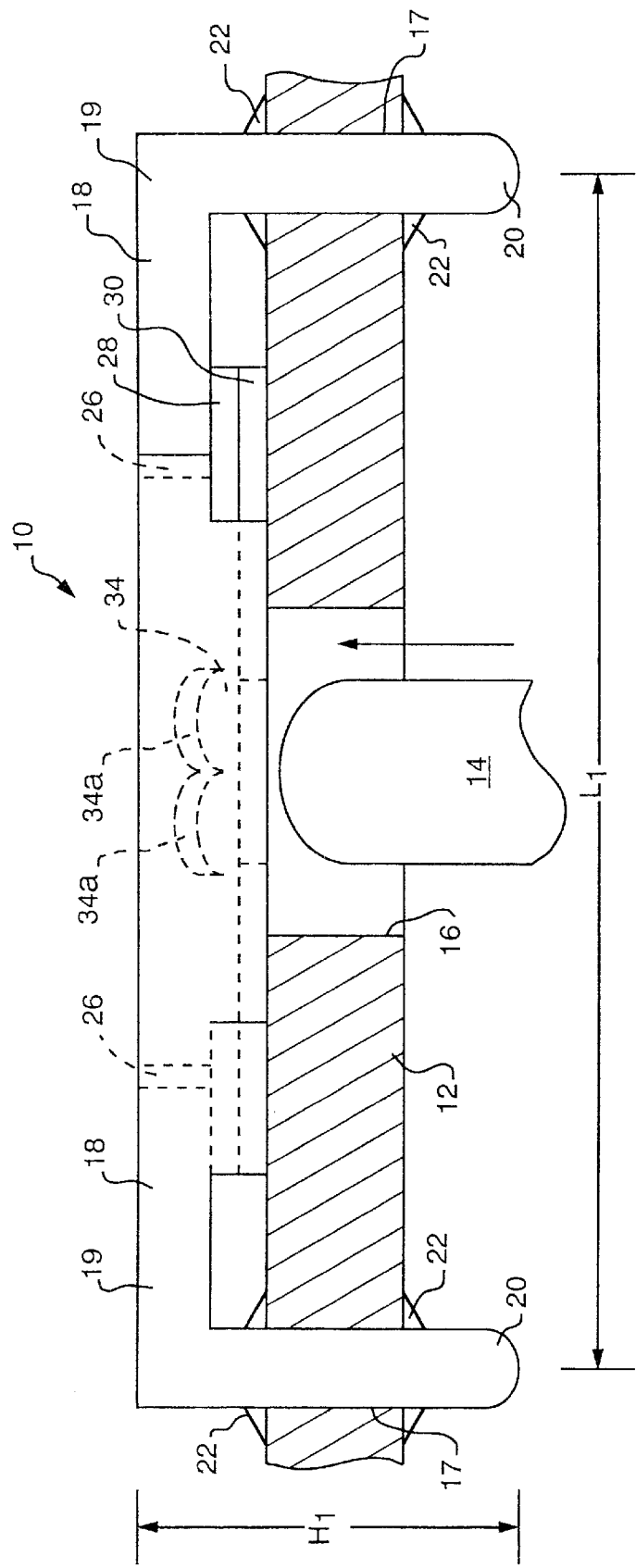
FIG. 2 is a side view of the present invention self-aligning electrical connector mounted to a PC board and engaging with a rigid contact.
Figure 3:
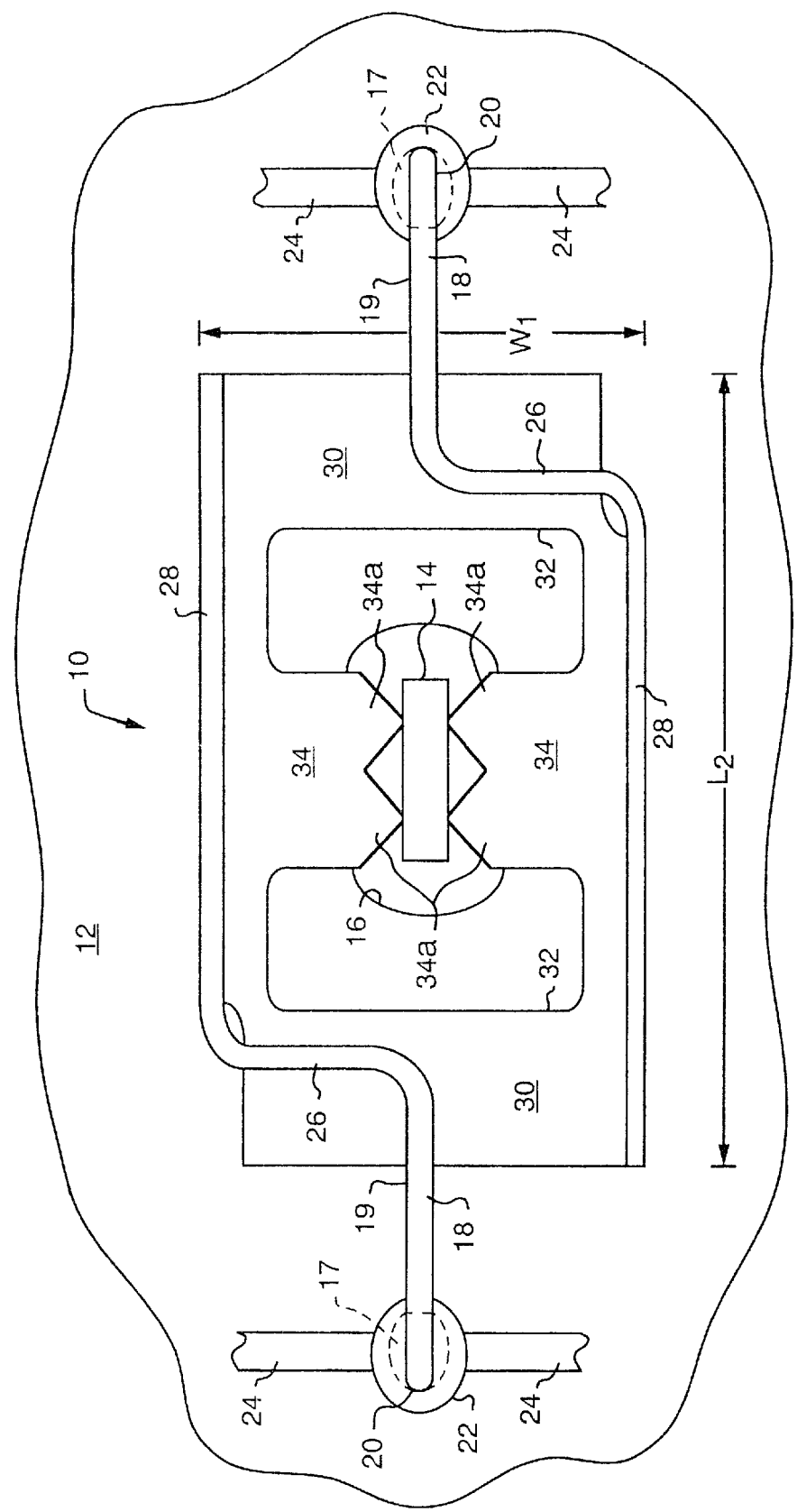
FIG. 3 is a top view of the electrical connector mounted to the PC board.
Figure 4:
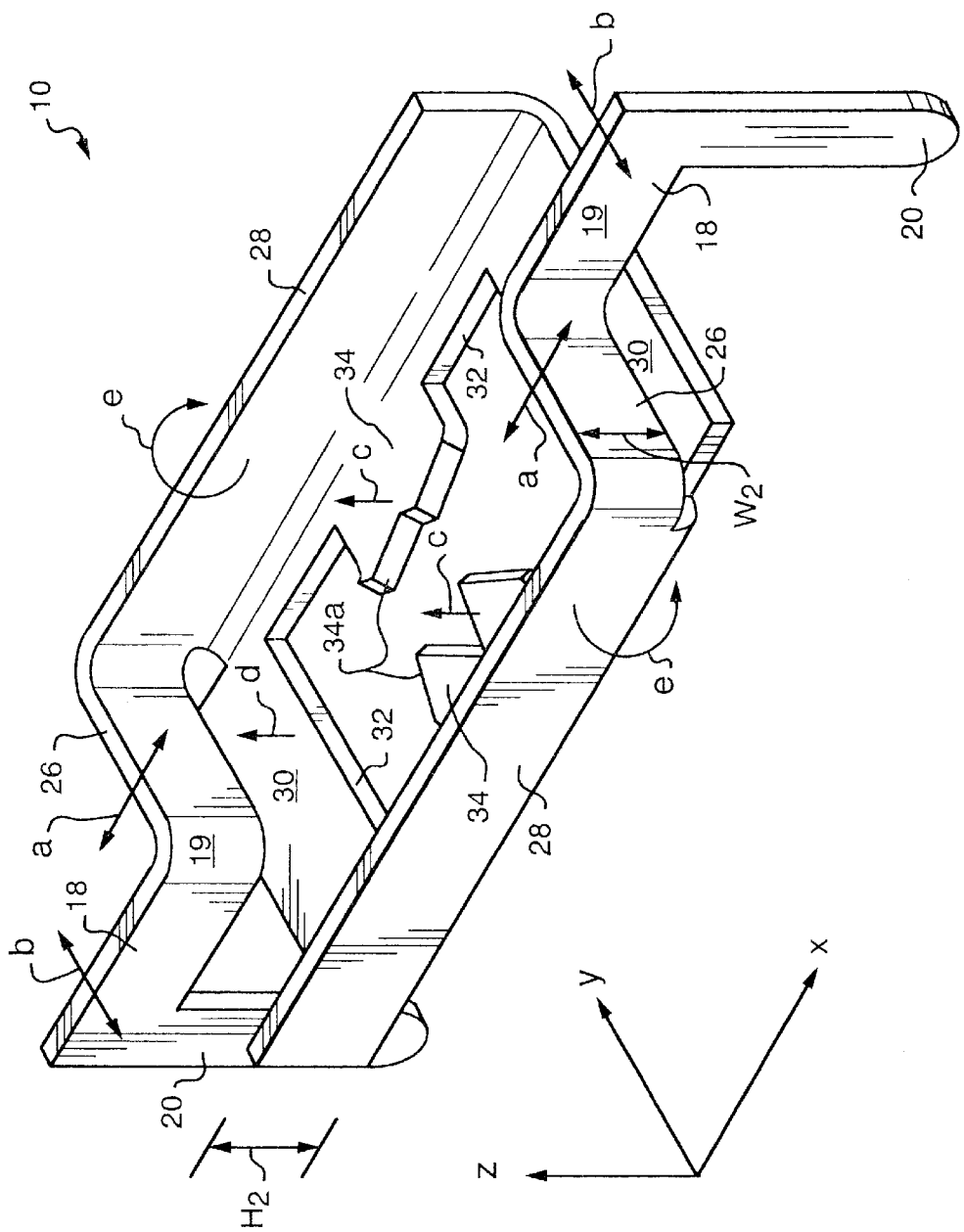
FIG. 4 is a perspective view of the present invention electrical connector.

Referring to FIGS. 2, 3 and 4, the present invention electrical connector 10 is a self-aligning connector for mounting to a PC board 12. Connector 10 is formed from sheet metal and includes a flat planar rectangular portion 30 with low opposing vertical walls 28 bent upwardly from planar portion 30 along two opposite sides for stiffness. The term "upwardly" is used merely to designate a direction relative to planar portion 30 and is not for the actual orientation of connector 10. Two contact tabs 34 are formed within the planar portion 30 between two rectangular holes 32. The contact tabs 34 extend towards each other at a slight upward angle and are separated by a gap. Each contact tab 34 has two pointed tips 34a. Two resilient beam members 19 extend from the ends of opposite walls 28 at diagonally opposite corners. The beam members 19 include a proximal beam portion 26 and a distal beam portion 18. The proximal beam portions 26 continue from and are bent at right angles to walls 28. The proximal beam portions 26 extend over the center of the planar portion 30. The distal beam portions 18 are bent at right angles to the proximal beam portions 26 so that distal beam portions 18 are parallel to walls 28. A small gap separates beam members 19 from the top surface of planar portion 30. The distal beam portions 18 extend beyond planar portion 30 along the centerline of connector 10 and terminate at terminal pins 20. Terminal pins 20 extend downwardly at a right angle from distal beam portions 18. The planar portion 30, walls 28 and beam members 19 form a resilient frame coupling the contact tabs 34 to the terminal pins 20.

In use, connector 10 is mounted to a PC board 12 by inserting terminal pins 20 through two holes 17 in PC board 12 until planar portion 30 rests on top of the PC board 12. The terminal pins 20 are secured to PC board 12 with solder 22. This electrically connects terminal pins 20 to conductive etchings 24 (FIG. 3) located on the surface of PC board 12. A hole 16 in PC board 12 is located below contact tabs 34. A rigid contact 14 for providing power or signals to PC board 12 from a power or signal source is inserted through hole 16 and into the gap between contact tabs 34. Rigid contact 14 is wider than the gap between contact tabs 34 so that contact tabs 34 are resiliently deflected upwardly and outwardly away from each other by rigid contact 14. Contact tabs 34 grip rigid contact 14 with enough force to maintain electrical communication therebetween. The pointed tips 34a of contact tabs 34 scrape or wipe any oxides or other contaminants on the surface of rigid contact 14 to provide a good electrical connection.

Referring to FIG. 4, the design of connector 10 allows contact tabs 34 to engage rigid contact 14 without exceeding the yield point of contact tabs 34. Resilient deflection of contact tabs 34 upwardly in the direction of arrows "c" by the engagement with rigid contact 14 also causes vertical walls 28 to resiliently twist in the direction of arrows "e" in a manner similar to a torsion bar. Planar portion 30 and walls 28 extend a sufficient length along the X axis to permit the twisting. Walls 28 provide stiffness against twisting of planar portion 30 in the direction of arrows "e". The twisting of walls 28 provides contact tabs 34 with upward movement in addition to that provided by the deflection of contact tabs 34. Additionally, deflection of contact tabs 34 in the direction of arrow "c" causes planar portion 30 to resiliently bow upwardly in the direction of arrows "d" providing further movement of contact tabs 34 upwardly. As a result, the movement of contact tabs 34 in the direction of arrows "c" is provided by the combination of the resilient deflection of contact tabs 34, the resilient twisting of vertical walls 28 and the resilient bowing of planar portion 30. In this manner, contact tabs 34 are allowed to move upwardly a given amount when engaged by rigid contact 14 without the contact tabs 34 themselves actually bending the full distance so that contact tabs 34 are deflected below the yield point of contact tabs 34. Accordingly, a constant gripping force can be more consistently maintained on rigid contact 14. The positioning of beam members 19 above planar portion 30 limits the amount that planar portion 30 can bow upwardly which prevents damage to planar portion 30.

The resilient frame of connector 10 also allows rigid contact 14 to be misaligned or moved relative to contact tabs 34. Proximal beam portions 26 are capable of resiliently deflecting in the direction of arrows "a" along the X axis of connector 10. In addition, distal beam portions 18 are capable of resiliently deflecting in the direction of arrows "b" along the Y axis. This allows movement of contact tabs 34 relative to terminal pins 20 along both the X and Y axes plus or minus about 1/64 of an inch to compensate for misalignment or movement of rigid contact 14 along those axes. The spring constant of beam portions 26 and 18 is preferably less than that for contact tabs 34 so that beam portions 26/18 will more likely deflect under a given load along the X and Y axes before contact tabs 34. This reduces the chance that electrical communication will be interrupted to rigid contact 14 during movement of rigid contact 14. Any misalignment or movement of rigid contact 14 along the Z axis can be compensated by the positioning or sliding of rigid contact 14 relative to contact tabs 34 along the Z axis. In addition, any misalignment or movement of rigid contact 14 along the X axis beyond the deflecting capabilities of proximal beam portion 26 can be compensated by the positioning or sliding of rigid contact 14 relative to contact tabs 34 along the X axis. Openings 32 are sufficiently large enough to accommodate such positioning or movement. Accordingly, rigid contact 14 can be slightly misaligned relative to contact tabs 34 along the X, Y and Z axes during engagement and is allowed to move relative to terminal pins 20 along those axes subsequent to engagement due to vibration, shock or thermal expansion.

In manufacture, electrical connector 10 is preferably stamped from a piece of sheet metal with walls 28, beam members 19, terminal pins 20 and contact tabs 34 all lying flat in a single plane with planar portion 30. The beam members 19, walls 28 and contact tabs 34 are later bent, thereby forming the final shape of connector 10. When finished, the top surfaces of walls 28 and beam members 19 lie along a common plane that is above and parallel to planar portion 30. Connector 10 is then plated with nickel and silver. Connector 10 is preferably stamped from 32 gauge (0.010 inches thick) phosphor bronze sheet metal. Connector 10 is nickel plated to a thickness of 0.0001 to 0.0002 inches and then silver plated to a thickness of 0.0001 to 0.0002 inches. Alternatively, connector 10 can be made from sheets of stainless steel or beryllium copper and plated with nickel or gold.

In one preferred embodiment, the distance $L_1$ between the center of terminal pins 20 is preferably about 0.500 inches (FIG. 2) with the height $H_1$ of terminal pins 20 being about 0.166 inches. The length $L_2$ of planar portion 30 (FIG. 3) is about 0.340 inches and the width $W_1$ is about 0.200 inches. The height $H_2$ (FIG. 4) of walls 28 is about 0.050 inches while the width $W_2$ of beam portions 26, 18 and terminal pins 20 is about 0.030 inches. Proximal beam portions 26 are bent at a right angle to walls 28 at about 0.060 inches from the ends of planar portion 30. Walls 28 extend to the edge of planar portion 30 at the ends opposite to beam members 19. Beam members 19 are positioned about 0.01 inches above the upper surface of planar portion 30. Contact tabs 34 are about 0.080 inches wide and are bent at about a 34° angle upwardly. This results in a horizontal length of about 0.034 inches for contact tabs 34. The tips 34a of contact tabs 34 are formed by 45° chamfers on the sides of each tip 34a. The gap between contact tabs 34 is about 0.026 inches for engaging with a rigid contact 14 about 0.032 inches thick. Contact tabs 34 have a combined gripping force of about 2.9 lbs. on rigid contact 14. Connector 10 is capable of maintaining electrical connection with rigid contact 14 when subjected to vibrations of 0–60 Hz along the X, Y and Z axes as well as for shock of up to 10 g.

Figure 5:
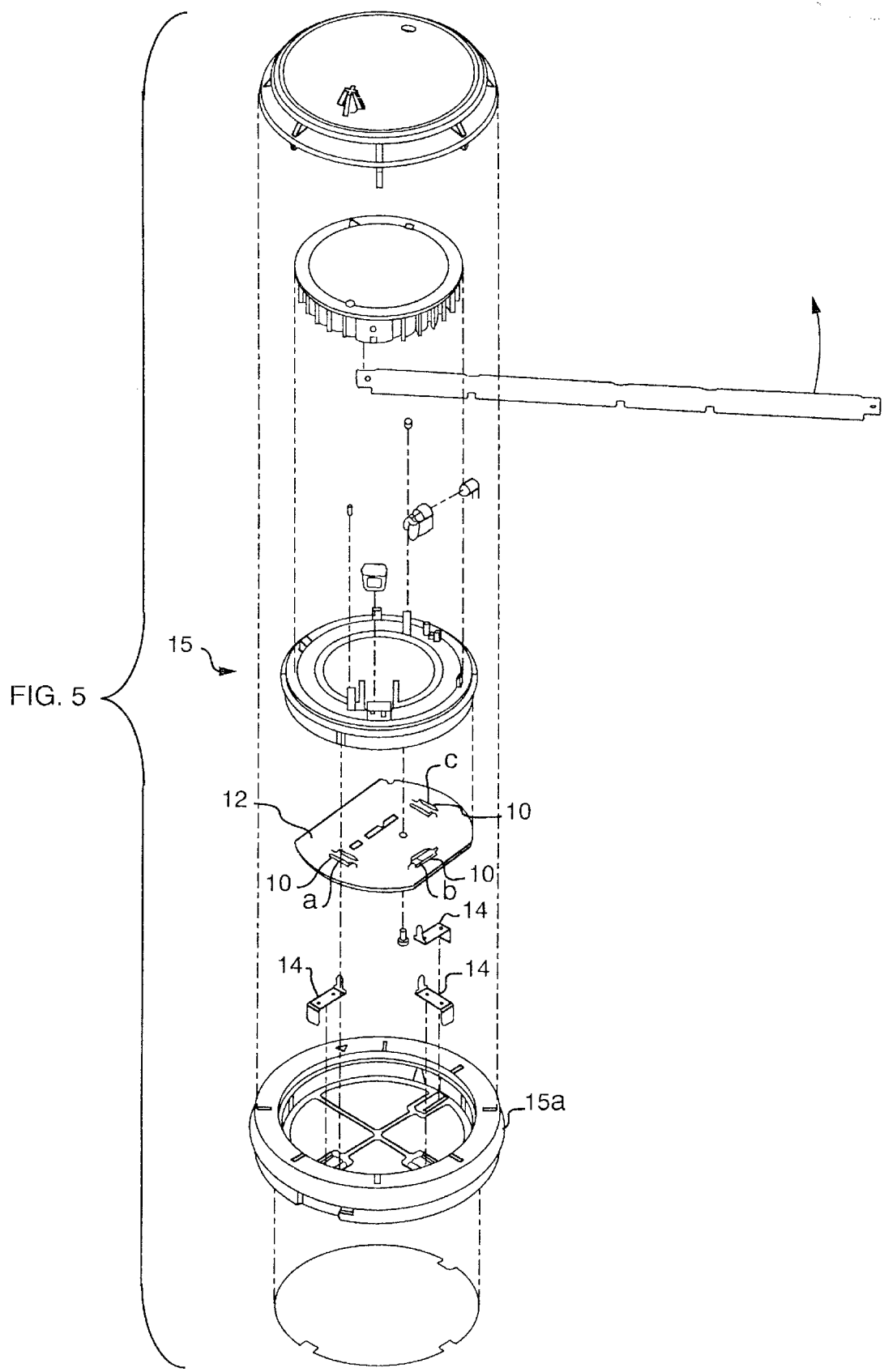
FIG. 5 is an exploded view of a smoke detector assembly employing the present invention electrical connector.

FIG. 5 depicts the use of connectors 10 in a smoke detector assembly 15. Three connectors 10 are mounted and electrically connected to PC board 12 at positions A, B and C. The connectors 10 at positions A and C are parallel to each other and perpendicular to the connector 10 at position B. The connectors 10 engage with three respective rigid contacts 14 which are mounted to base 15a. The rigid contacts 14 are electrically connected to power and signal sources.

Figure 6:
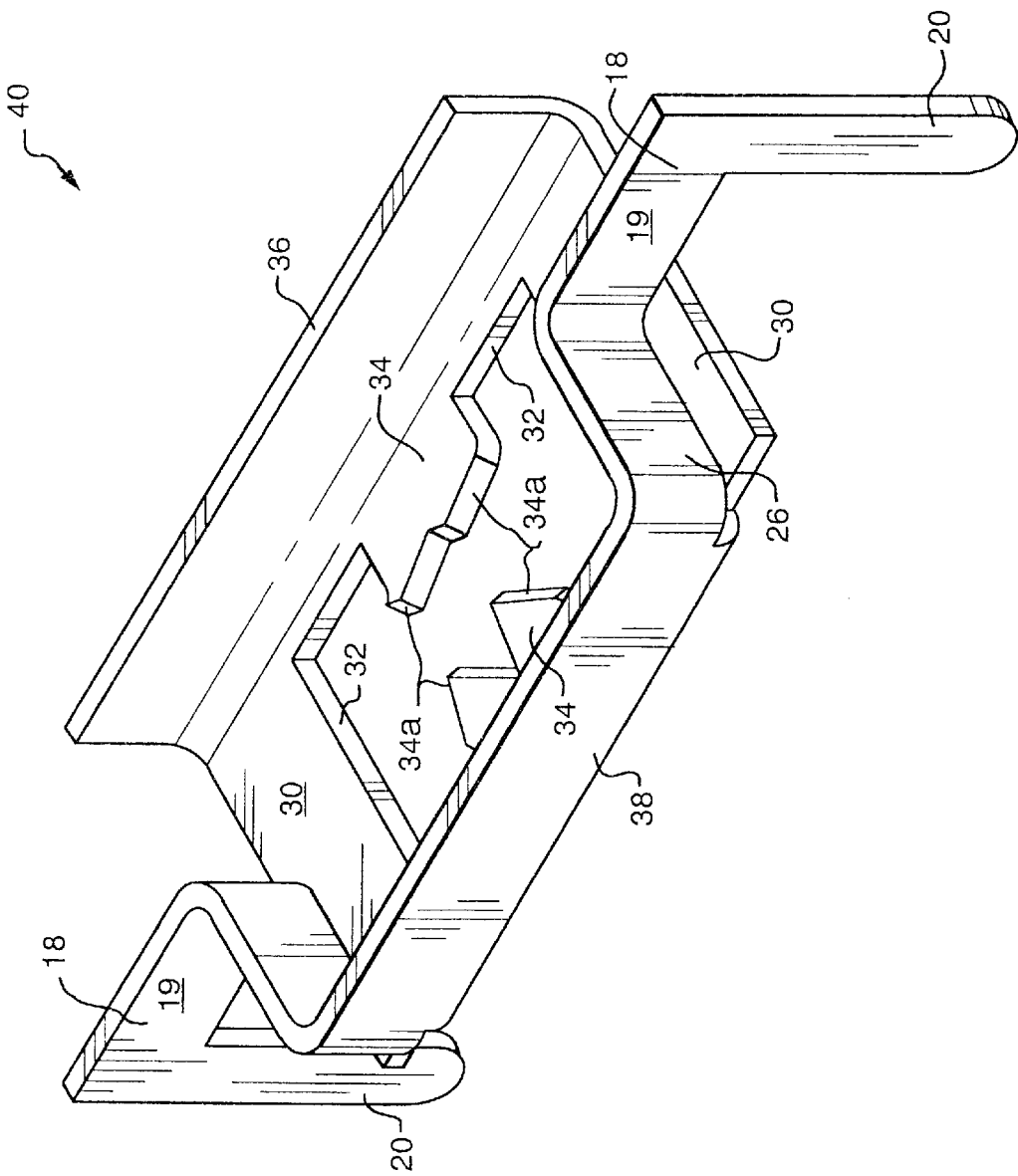
FIG. 6 is a perspective view of another preferred electrical connector.

FIG. 6 depicts another preferred connector 40 which differs from connector 10 in that connector 40 has a vertical wall 36 bent upwardly from planar portion 30 that extends the full length of planar portion 30. In addition, both deflectable beams 19 extend from the ends of the vertical wall 38 that is opposite to wall 36.

Figure 7:
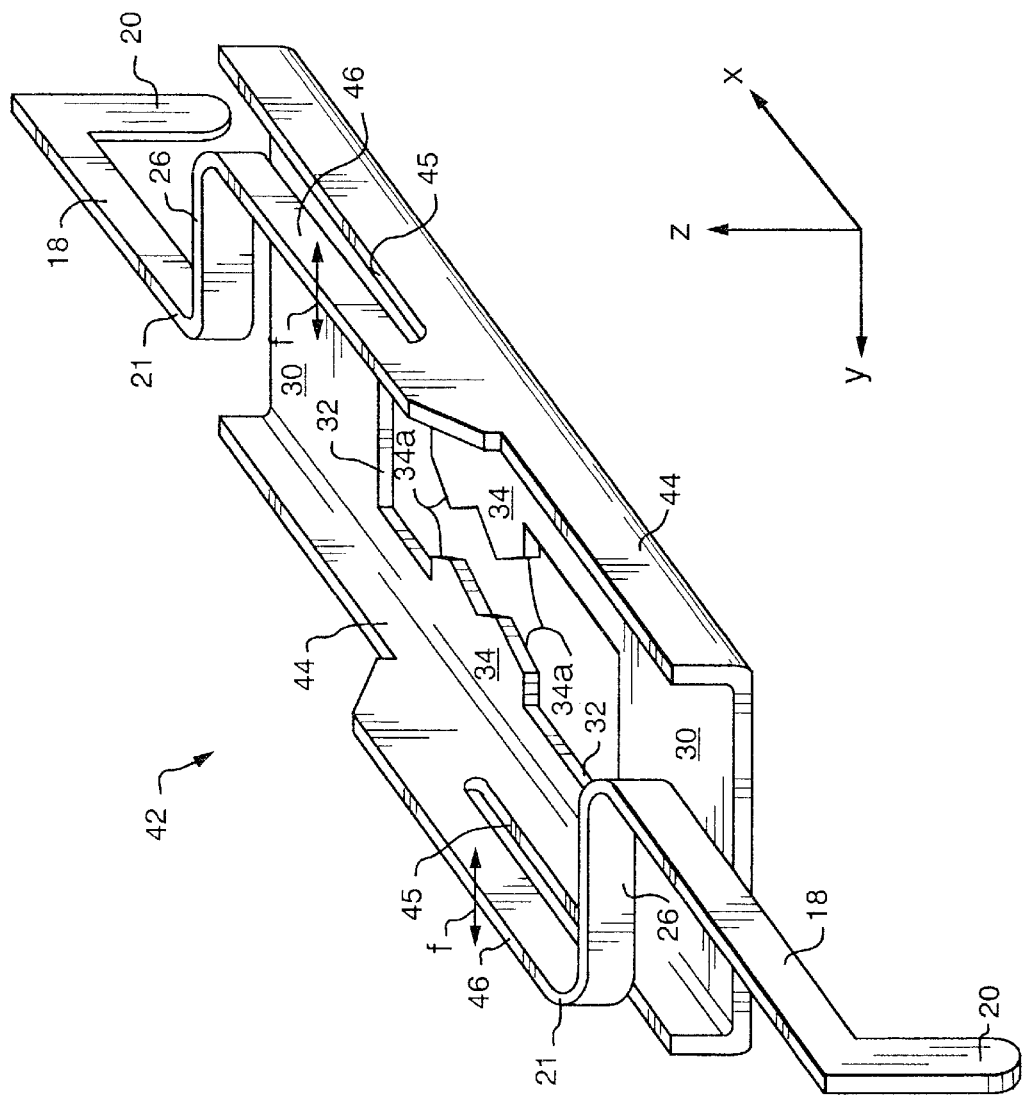
FIG. 7 is a perspective view of still another preferred electrical connector.

Referring to FIG. 7, electrical connector 42 is another preferred connector which differs from connector 10 in that the connector 42 includes resilient deflectable beams 21 which extend from the upper surface of vertical walls 44 near the center of walls 44. Each deflectable beam 21 includes an additional resilient deflectable beam portion 46 which is spaced above the upper surface of wall 44 by a slot 45. Beam portions 46 extend along a substantial length of walls 44 and lie along the same planes as walls 44. Beam portions 46 are capable of deflecting in the direction of arrows "f" along the Y axis which allows connector 42 to rotate about the Z axis. As a result, connector 42 can compensate for misalignment and movement of rigid contact 14 along the X, Y and Z axes as well as rotation about the Z axis.

Figure 8:
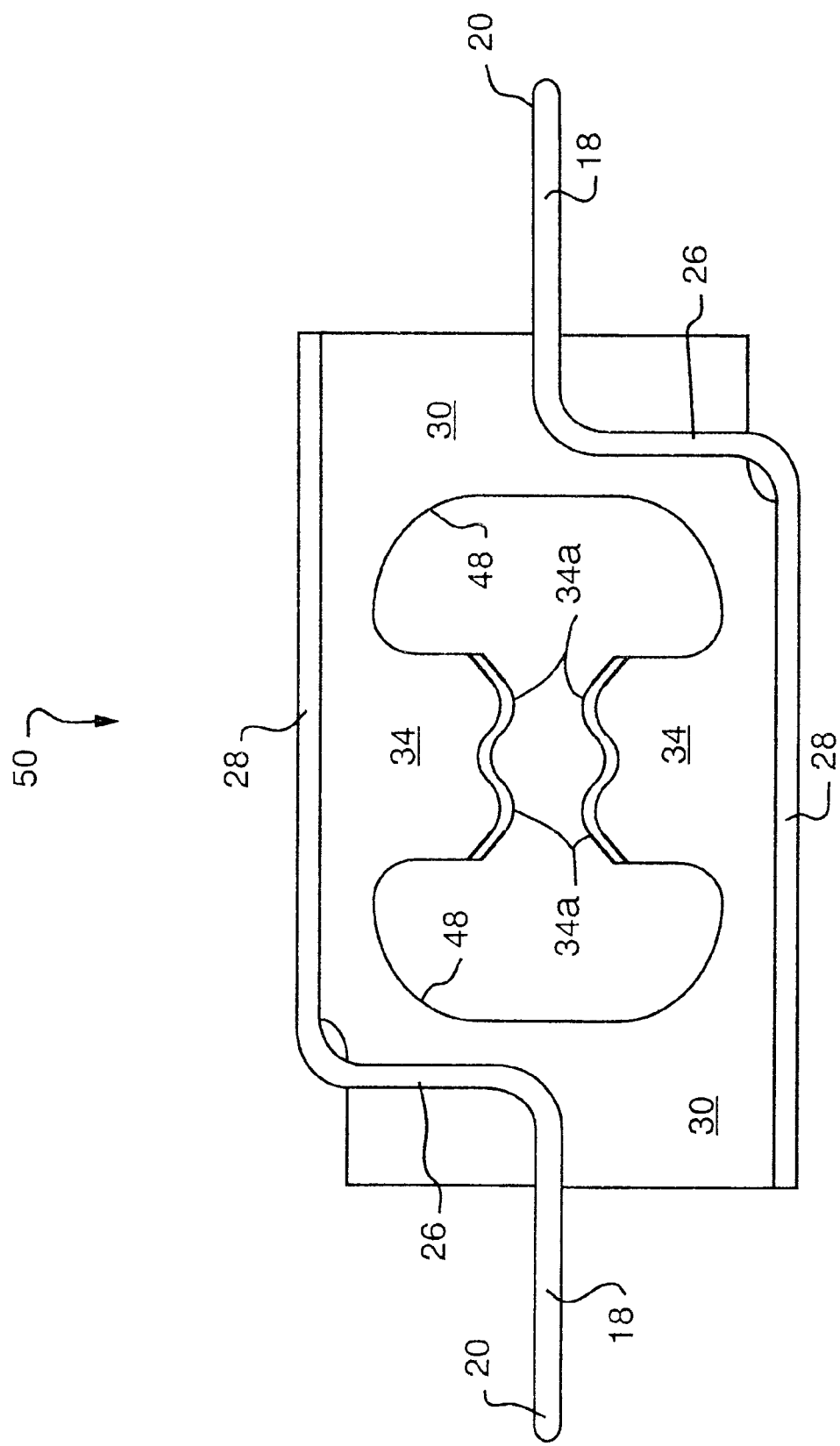
FIG. 8 is a plan view of yet another preferred electrical connector.

FIG. 8 is still another preferred electrical connector 50 which differs from connector 10 in that openings 48 have larger curved radii at the corners. The use of radii at the corners reduce stress concentrations on planar portion 30.

Figure 9:
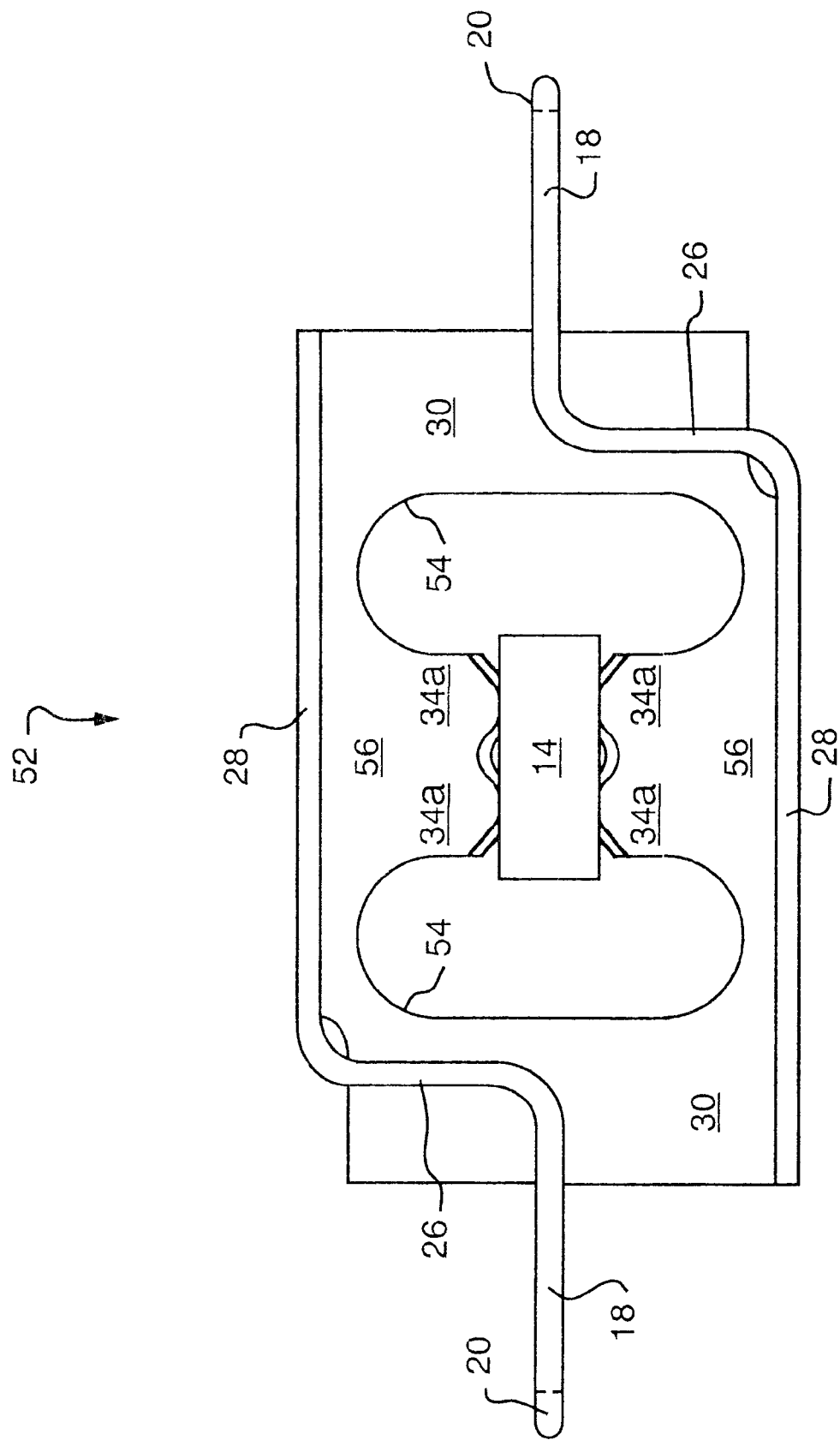
FIG. 9 is a plan view of still another preferred electrical connector.

FIG. 9 is yet another preferred electrical connector 52 which differs from connector 50 in that openings 54 have large radii at the corners of openings 54 adjacent to contact tabs 56 which form a wider and stiffer base for contact tabs 56 than that provided for contact tabs 34. This results in a higher gripping force by contact tabs 56 than by contact tabs 34 due to increased stiffness.

The connectors of the present invention are typically engaged with flat rigid contacts but alternatively can be engaged with round rigid contacts. Although the present invention connectors are generally employed for connecting power or signals to a PC board, the connectors can also be used for connecting PC boards or assemblies together.

EQUIVALENTS

While this invention has been particularly shown and described with references to preferred embodiments thereof, it will be understood by those skilled in the art that various changes in form and details may be made therein without departing from the spirit and scope of the invention as defined by the appended claims. Those skilled in the art will recognize or be able to ascertain using no more than routine experimentation, many equivalents to the specific embodiments of the invention described specifically herein. Such equivalents are intended to be encompassed in the scope of the claims.

For example, it can be seen that variations in geometry and dimensions of the present invention connector can provide different deflection and gripping properties. Although particular dimensions and geometries have been shown and described for connector 10, those dimensions and geometries are subject to change depending upon the application. In addition, although the terminal pins in the present invention have been depicted to extend downwardly, other suitable configurations can be employed. Furthermore, beam members 19 can be straight so that beam members 19 lie in the same plane as walls 28. In this configuration, any misalignment or movement of rigid contact 14 along the X axis is compensated by the positioning or sliding of rigid contact 14 relative to contact tabs 34 along the X axis. Finally, although the electrical contact formed by contact tabs 34 is a female type contact, alternatively, contact tabs 34 can be substituted with a male type contact.

What is claimed is:

1. A self aligning electrical connector for providing electrical communication between two electrical devices comprising:
   an electrical contact; and
   a terminal system resiliently coupled to the electrical contact by a resilient frame, the resilient frame having a planar portion from which the electrical contact extends with a vertical side wall extending from the planar portion, and a resilient beam extending from the side wall, the resilient frame capable of allowing the electrical contact to move relative to the terminal system along X and Y axes.

2. The connector of claim 1 in which the terminal system comprises two terminal pins.

3. The connector of claim 2 in which the resilient frame comprises two resilient beams each resiliently coupled between a respective terminal pin and the electrical contact.

4. The connector of claim 3 in which each terminal pin extends downwardly from a respective resilient beam.

5. The connector of claim 3 in which each resilient beam comprises a proximal portion capable of deflecting along one of the X and Y axes and a distal portion capable of deflecting along the other of the X and Y axes.

6. The connector of claim 5 in which the proximal beam portion and the distal beam portion are formed at right angles relative to each other.

7. The connector of claim 6 in which the electrical contact comprises two opposing grippable contact tabs angled upwardly and separated by a gap, the contact tabs capable of deflecting upwardly.

8. The connector of claim 7 in which the contact tabs each have two pointed contact tips.

9. The connector of claim 1 in which the side wall is one of a pair of vertical side walls extending upwardly from opposite edges of the planar portion, and the resilient beam is one of two resilient beams extending from at least one side wall.

10. The connector of claim 9 in which the planar portion is capable of resiliently bowing upwardly and the side walls are capable of resiliently twisting when the contact tabs are resiliently deflected upwardly.

11. The connector of claim 10 in which a portion of the resilient beams extend over the planar portion, thereby limiting the amount of bowing of the planar portion.

12. A self-aligning electrical connector for providing electrical communication between two electrical devices comprising:
    a planar portion having edges;
    an electrical contact extending from the planar portion, the electrical contact comprising two opposed contact tabs located between two openings in the planar portion, the contact tabs being angled upwardly and separated by a gap;
    a pair of vertical side walls extending upwardly from opposite edges of the planar portion;
    a pair of resilient beams extending from at least one side wall, the resilient beams capable of deflecting along X and Y axes; and
    a pair of terminal pins, each terminal pin extending from a respective resilient beam.

13. The connector of claim 12 in which the contact tabs have two pointed contact tips.

14. The connector of claim 12 in which the terminal pins extend downwardly.

15. The connector of claim 12 in which each resilient beam comprises a proximal portion capable of deflecting along one of the X and Y axes and a distal portion capable of deflecting along the other of the X and Y axes.

16. The connector of claim 15 in which the proximal beam portion and the distal beam portion are formed at right angles relative to each other.

17. A self aligning electrical connector for providing electrical communication between two electrical devices comprising:

an electrical contact comprising two opposing contact tabs angled upwardly and separated by a gap; and a terminal resiliently connected to the electrical contact by a resilient frame, the resilient frame having a planar portion from which the electrical contact extends with a vertical side wall extending from the planar portion, and a resilient beam member extending from the side wall, the beam member allowing the electrical contact to move relative to the terminal along at least one axis.

18. A self aligning electrical connector for a PC board in a smoke detector assembly for providing electrical communication between a rigid contact in the assembly and the PC board, the connector comprising:

an electrical contact; and a terminal system for mounting to the PC board, the terminal system resiliently coupled to the electrical contact by a resilient frame, the resilient frame having a planar portion from which the electrical contact extends with a vertical side wall extending from the planar portion, and a resilient beam extending from the side wall, the resilient frame capable of allowing the electrical contact to move relative to the terminal system along X and Y axes.

19. A method of forming a self-aligning electrical connector for providing electrical communication between two electrical devices comprising the steps of:

providing an electrical contact; and resiliently coupling a terminal system to the electrical contact with a resilient frame, the resilient frame having a planar portion from which the electrical contact extends with a vertical side wall extending from the planar portion, and a resilient beam extending from the side wall, the resilient frame capable of allowing the electrical contact to move relative to the terminal system along X and Y axes.

20. The method of claim 19 in which the terminal system comprises two downwardly extending terminal pins and the resilient frame comprises two resilient beams, the method further comprising the step of resiliently coupling each terminal pin to the electrical contact with a resilient beam.

21. The method of claim 20 further comprising the step of forming each resilient beam with a proximal portion capable of deflecting along one of the X and Y axes and a distal portion capable of deflecting along the other of the X and Y axes, the proximal portion and the distal portion being at right angles relative to each other.

22. The method of claim 21 further comprising the step of providing the electrical contact with two opposing grippable contact tabs angled upwardly and separated by a gap, the contact tabs capable of deflecting upwardly.

23. The method of claim 21 further comprising the step of forming the resilient frame with a pair of vertical side walls extending upwardly from opposite edges of the planar portion, and two resilient beams extending from at least one side wall.

24. The method of claim 23 further comprising the step of extending a portion of the resilient beams over the planar portion for limiting bowing of the planar portion.

25. A self aligning electrical connector for providing electrical communication between two electrical devices comprising:

an electrical contact; and a terminal system resiliently coupled to the electrical contact by a resilient frame, the resilient frame having a planar portion from which the electrical contact extends with a pair of vertical side walls extending upwardly from opposite edges of the planar portion, and two resilient beams extending from at least one side wall, the resilient frame capable of allowing the electrical contact to move relative to the terminal system along X and Y axes.

26. The connector of claim 25 in which the planar portion is capable of resiliently bowing upwardly and the side walls are capable of resiliently twisting when the contact tabs are resiliently deflected upwardly.

27. The connector of claim 26 in which a portion of the resilient beams extend over the planar portion, thereby limiting the amount of bowing of the planar portion.

28. A method of forming a self-aligning electrical connector for providing electrical communication between two electrical devices comprising the steps of:

providing an electrical contact; and resiliently coupling a terminal system having two downwardly extending terminal pins to the electrical contact with a resilient frame, the resilient frame having a planar portion from which the electrical contact extends with a pair of vertical side walls extending upwardly from opposite edges of the planar portion, and two resilient beams extending from at least one side wall, each terminal pin being resiliently coupled to a resilient beam, each resilient beam having a proximal portion capable of deflecting along one of the X and Y axes and a distal portion capable of deflecting along the other of the X and Y axes, the proximal portion and the distal portion being at right angles relative to each other, the resilient frame capable of allowing the electrical contact to move relative to the terminal system along X and Y axes.

29. The method of claim 28 further comprising the step of extending a portion of the resilient beams over the planar portion for limiting bowing of the planar portion.

* * * * *